United States Patent [19]
Schrittesser

[11] Patent Number: 6,043,701
[45] Date of Patent: Mar. 28, 2000

[54] CIRCUIT CONFIGURATION FOR PROTECTING A POWER MOSFET

[75] Inventor: Gerold Schrittesser, Villach, Austria

[73] Assignee: Siemens Aktiengesellschaft, Munich, Germany

[21] Appl. No.: 08/897,116

[22] Filed: Jul. 18, 1997

[30] Foreign Application Priority Data

Jul. 18, 1996 [DE] Germany ............. 196 29 056

[51] Int. Cl.[7] ................................................. H03K 17/04
[52] U.S. Cl. ........................... 327/375; 327/309; 327/326
[58] Field of Search .................................. 327/374, 375, 327/376, 377, 188, 514, 515, 427, 309, 314, 318, 319, 320, 322, 326; 361/90, 91, 92

[56] References Cited

U.S. PATENT DOCUMENTS

| 4,574,266 | 3/1986 | Valentine | 340/635 |
| 4,801,824 | 1/1989 | Fellinger et al. | 327/319 |
| 4,853,563 | 8/1989 | Hill et al. | 326/83 |
| 5,162,966 | 11/1992 | Fujihira | 257/140 |
| 5,767,550 | 6/1998 | Calafut et al. | 257/355 |

FOREIGN PATENT DOCUMENTS

4122347A1  2/1992  Germany.

OTHER PUBLICATIONS

"Smart SIPMOS TEMPFET, PROFET, Dimmer" Data Book 1993–94, pp. 2–7.

Primary Examiner—Kenneth B. Wells
Assistant Examiner—Hai L. Nguyen
Attorney, Agent, or Firm—Herbert L. Lerner; Laurence A. Greenberg; Werner H. Stemer

[57] ABSTRACT

A circuit configuration for protecting a MOSFET against overvoltages, includes at least one diode connected in the blocking direction between a drain terminal and a gate terminal of the MOSFET to be protected. A series connection of a load path of a further MOSFET and a further Zener diode connected in the blocking direction, is connected between the at least one Zener diode and the gate terminal of the MOSFET to be protected. A cathode of the further Zener diode is connected to a gate terminal of the further MOSFET.

2 Claims, 1 Drawing Sheet

PRIOR ART

CIRCUIT CONFIGURATION FOR PROTECTING A POWER MOSFET

BACKGROUND OF THE INVENTION

Field of the Invention

The present invention relates to a circuit configuration for protecting a power MOSFET.

Circuit configurations for protecting power MOSFETs against overvoltage have long been known and are shown, for instance, in the Siemens Datenbuch [Siemens Databook] "Smart-SIPMOS", 1994/95, pages 2–7, FIG. 4. An overvoltage protection circuit configuration disclosed therein includes a Zener diode ZD2 and a diode D1.

A MOSFET semiconductor component with a voltage spike protection element which is also known from German Published, Non-Prosecuted Patent Application DE 41 22 347 A1, includes a transistor element with a gate electrode, a source electrode, and a drain electrode. In it, a Zener diode with a cathode electrode and an anode electrode is coupled to the drain electrode of the transistor element. A horizontal MOSFET element is also presented that has a gate electrode and a drain electrode. The drain electrode is coupled to the anode electrode of the Zener diode, and the source electrode of the MOSFET element is coupled to the gate electrode of the transistor element. A back-gate electrode which is also proposed therein is coupled to the source electrode of the transistor element.

The wiring of the MOSFET referred to at the outset may also be achieved by using an MOS diode which is realized by an MOS transistor having a gate terminal and a drain terminal that are short-circuited, instead of using the diode D1. FIG. 2 shows one such circuit, which is described in more detail below. In particular, such a protective circuit configuration is used in high-side switches with a charge pump. The MOS diode then takes on the task of blocking the high gate voltage from the supply in the normal operating state. In the event of overvoltage, that MOS diode is operated in the conducting direction, but the on-state voltage can assume undesirably high values under some circumstances.

SUMMARY OF THE INVENTION

It is accordingly an object of the invention to provide a circuit configuration for protecting a power MOSFET, which overcomes the hereinafore-mentioned disadvantages of the heretofore-known devices of this general type and in which an on-state voltage of the protective circuit configuration is reduced to a negligibly low value.

With the foregoing and other objects in view there is provided, in accordance with the invention, a circuit configuration for protecting a MOSFET against overvoltages, comprising at least one Zener diode connected in blocking direction to a drain terminal of a MOSFET to be protected; and a series circuit connected between the at least one Zener diode and a gate terminal of the MOSFET to be protected; the series circuit including a load path of a further MOSFET and a further Zener diode connected in blocking direction, the further MOSFET having a gate terminal and the further Zener diode having a cathode connected to the gate terminal of the further MOSFET.

In accordance with a concomitant feature of the invention, there is provided a current source keeping the gate terminal of the further MOSFET at a defined potential.

Other features which are considered as characteristic for the invention are set forth in the appended claims.

Although the invention is illustrated and described herein as embodied in a circuit configuration for protecting a power MOSFET, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 2:
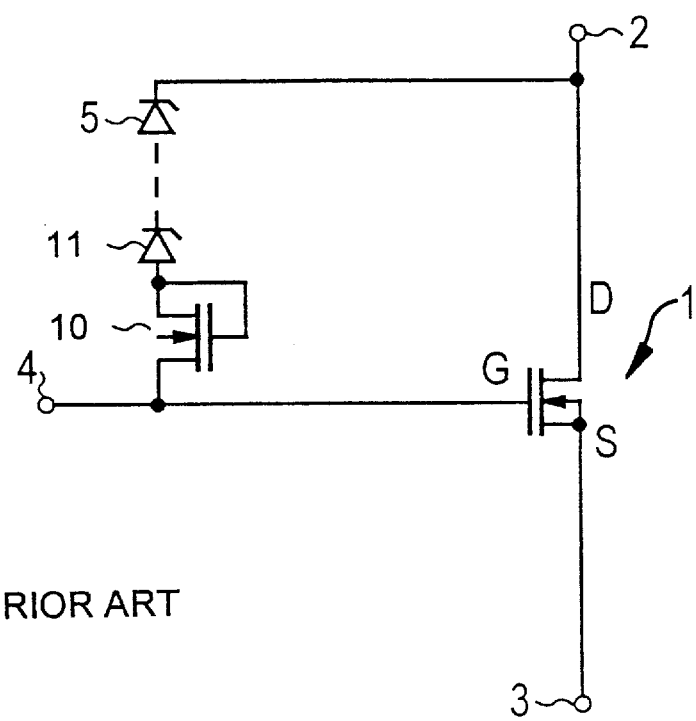
FIG. 2 is a circuit diagram of a configuration according to the prior art.

Referring now to the figures of the drawings in detail and first, particularly, to FIG. 2 thereof, there is seen a MOSFET to be protected, which is identified by reference numeral 1. A series circuit of an MOS diode 10 connected in the flow direction and a plurality of diodes 5, 11 connected in the blocking direction, is connected between a gate terminal and a drain terminal of the MOSFET 1. The drain terminal of the MOSFET 1 is also connected to a terminal clamp 2, a source terminal thereof is connected to a terminal clamp 3 and a gate terminal thereof is connected to a terminal clamp 4.

As mentioned above, such a protective circuit configuration is used in high-side switches with a charge pump. In such a case the MOS diode 10 takes on the task of blocking the high gate voltage from the supply in the normal operating state. Upon an overvoltage, the MOS diode 10 is operated in the conducting direction, but the on-state voltage can assume undesirably high values under some circumstances.

Figure 1:
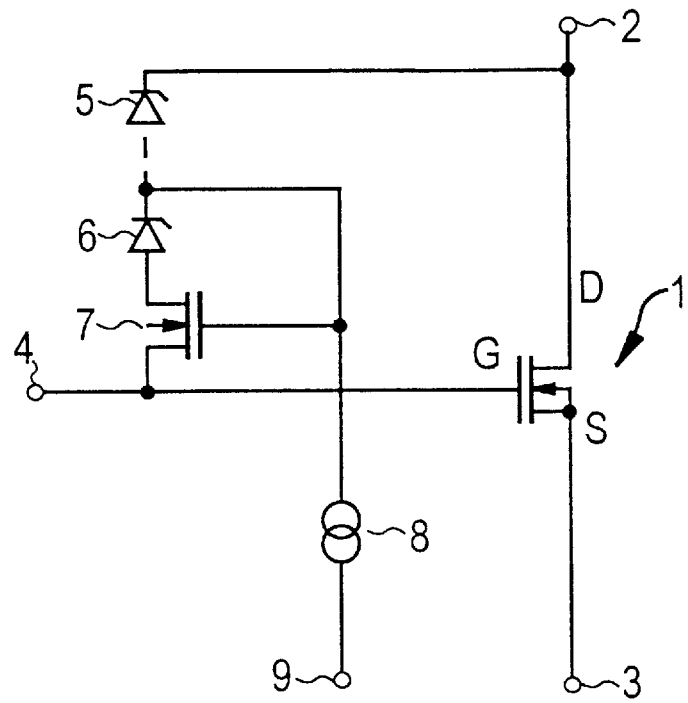
FIG. 1 is a basic schematic circuit diagram of a configuration according to the invention.

In FIG. 1, reference numeral 1 indicates a semiconductor switch to be protected, in this case a high-side switch, having a drain terminal which is connected to a terminal clamp 2 and a source terminal that is connected to a terminal clamp 3. A gate terminal of the high-side switch 1 is connected to a terminal clamp 4. The gate terminal is also connected to a source terminal of an n-channel MOSFET 7. A drain terminal of the further MOSFET 7 is connected to an anode of a further Zener diode 6. A cathode of the Zener diode 6 is connected to the gate terminal of the MOSFET 7 and is connected through a current source 8 to a terminal clamp 9. The cathode of the Zener diode 6 is also connected through a number of series-connected Zener diodes 5, that are connected in the blocking direction (only one of which is shown) according to the prior art, to the drain terminal of the high-side switch 1.

Through the use of the MOS transistor 7, having a gate voltage which is raised above its source voltage by a Zener voltage, namely that of the Zener diode 6, instead of using the MOS diode 10 of FIG. 2, its on-state voltage is reduced to a negligibly low value.

In FIG. 1, the gate terminal of the MOSFET 7 is additionally kept at a defined potential by the terminal clamp 9 and the current source 8 connected thereto.

I claim:

1. A circuit configuration for protecting a MOSFET against overvoltages, comprising:

at least one Zener diode connected in a blocking direction between a drain terminal and a gate terminal of a MOSFET to be protected; and a series circuit connected between said at least one Zener diode and a gate terminal of the MOSFET to be protected;

said series circuit including a load path of a further MOSFET and a further Zener diode connected in the blocking direction, said further MOSFET having a gate terminal and said further Zener diode having a cathode connected to the gate terminal of said further MOSFET.

2. The circuit configuration according to claim 1, including a current source keeping the gate terminal of said further MOSFET at a defined potential.

* * * * *